United States Patent
Li

(10) Patent No.: US 7,443,676 B1
(45) Date of Patent: Oct. 28, 2008

(54) HEAT DISSIPATION DEVICE

(75) Inventor: Dong-Yun Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/836,715

(22) Filed: Aug. 9, 2007

(51) Int. Cl.
*H05K 7/20* (2006.01)
*F28F 7/00* (2006.01)

(52) U.S. Cl. ............... 361/700; 165/80.3; 165/104.33; 165/121; 165/122; 361/697; 361/695; 361/719

(58) Field of Classification Search ............ 165/104.33; 361/697, 700
See application file for complete search history.

(56) References Cited

U.S. PATENT DOCUMENTS

| | | | |
|---|---|---|---|
| 6,479,895 B1 * | 11/2002 | Lee et al. ................. | 257/720 |
| 6,989,988 B2 * | 1/2006 | Arbogast et al. ............ | 361/695 |
| 7,145,422 B2 * | 12/2006 | Imanishi et al. ............. | 335/201 |
| 7,215,548 B1 * | 5/2007 | Wu et al. ................. | 361/703 |
| 7,349,212 B2 * | 3/2008 | Xia et al. ................. | 361/697 |
| 2006/0137861 A1 * | 6/2006 | Wang et al. ............ | 165/104.33 |
| 2007/0261822 A1 * | 11/2007 | Lin et al. ............... | 165/104.33 |
| 2007/0274038 A1 * | 11/2007 | Sun ....................... | 361/695 |
| 2008/0062641 A1 * | 3/2008 | Lai et al. ................. | 361/695 |
| 2008/0121372 A1 * | 5/2008 | Zhou et al. .............. | 165/80.3 |
| 2008/0128111 A1 * | 6/2008 | Zhou et al. .............. | 165/80.3 |
| 2008/0135215 A1 * | 6/2008 | Wu ..................... | 165/104.33 |
| 2008/0144286 A1 * | 6/2008 | Li et al. ................. | 361/701 |

* cited by examiner

*Primary Examiner*—Gregory D Thompson
(74) *Attorney, Agent, or Firm*—Steven M. Reiss

(57) ABSTRACT

A heat dissipation device adapted for dissipating heat of a CPU and other electronic components such as MOSFETS mounted on a printed circuit board, includes a base mounted on the CPU, a fin set disposed on the base and a fan attached to a lateral side of the base and the fin set. The lateral side of the base is provided with an air-guiding part facing the fan, to guide a lower portion of airflow generated by the fan to pass through the electronic components such as MOSFETS mounted on the printed circuit board and around the CPU. An upper portion of the airflow flows through the fin set.

14 Claims, 4 Drawing Sheets

HEAT DISSIPATION DEVICE

BACKGROUND OF THE INVENTION

1. Field of the Invention

The present invention relates generally to a heat dissipation device, and more particularly to a heat dissipation device capable of removing heat from a CPU and a plurality of electronic components such as MOSFETS around the CPU simultaneously.

2. Description of Related Art

Electronic component includes numerous circuits mounted on a printed circuit board of an electronic equipment, operating at high speed and generating substantive heat. In many applications, it is desirable to employ heat sinks to remove the heat from the heat-generating electronic components, such as central processing units (CPUs), to assure that the components function properly and reliably. A conventional heat sink comprises a base for contacting with the heat-generating component to absorb the heat generated by the heat-generating component and a plurality of parallel planar fins attached to the base by soldering or adhering. Alternatively, the fins can be integrally formed with the base by metal extrusion, such as aluminum extrusion. The fins are used for dissipating the heat from the base to ambient air. To improve heat dissipating efficiency of the heat sink, a fan is mounted on a top or a lateral side of the heat sink to provide an airflow to circulate over and around the fins thereby transferring heat from the fins into the ambient air.

However, except the CPU, a plurality of electronic components such as MOSFETS (Metal Oxide Semiconductor Field Effect Transistors) mounted around the CPU are also sources of heat that need to be dissipated. The MOSFETS on the printed circuit board regulate and provide power for the CPU. The MOSFETS radiate the heat to the printed circuit board and cause temperature of the printed circuit board to increase quickly, whereby a life-span of the electronic equipment is shortened. The heat sink mentioned above is able to effectively remove heat from the CPU but unable to cool the MOSFETS simultaneously; thus, the printed circuit board is adversely affected by the heat generated by the MOSFETS.

What is needed is a heat dissipation device capable of removing heat from a CPU and a plurality of electronic components such as MOSFETS surrounding the CPU simultaneously.

SUMMARY OF THE INVENTION

The present invention relates to a heat dissipation device for dissipating heat of a CPU and other electronic components, such as MOSFETS mounted on a printed circuit board. The heat dissipation device includes a base mounted on the CPU, a fin set disposed on the base and a fan attached to a lateral side of the base and the fin set. The lateral side of the base is provide with an air-guiding part facing the fan, to guide a lower portion of an airflow generated by the fan to pass through the electronic components such as MOSFETS mounted on the printed circuit board and around the CPU. An upper portion of the airflow flows through the fin set.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
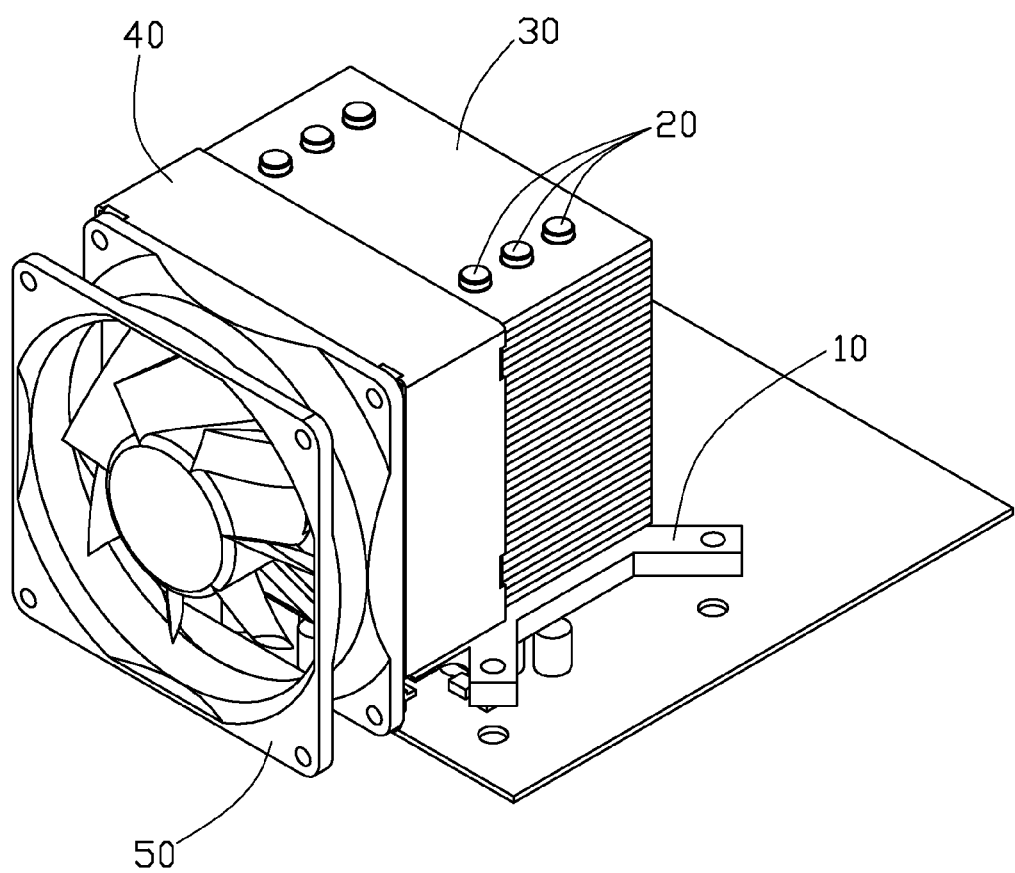
FIG. 1 is an assembled view of a heat dissipation in accordance with a preferred embodiment of the present invention accompanying a printed circuit board and a plurality of electronic components located on the printed circuit board.
Figure 2:
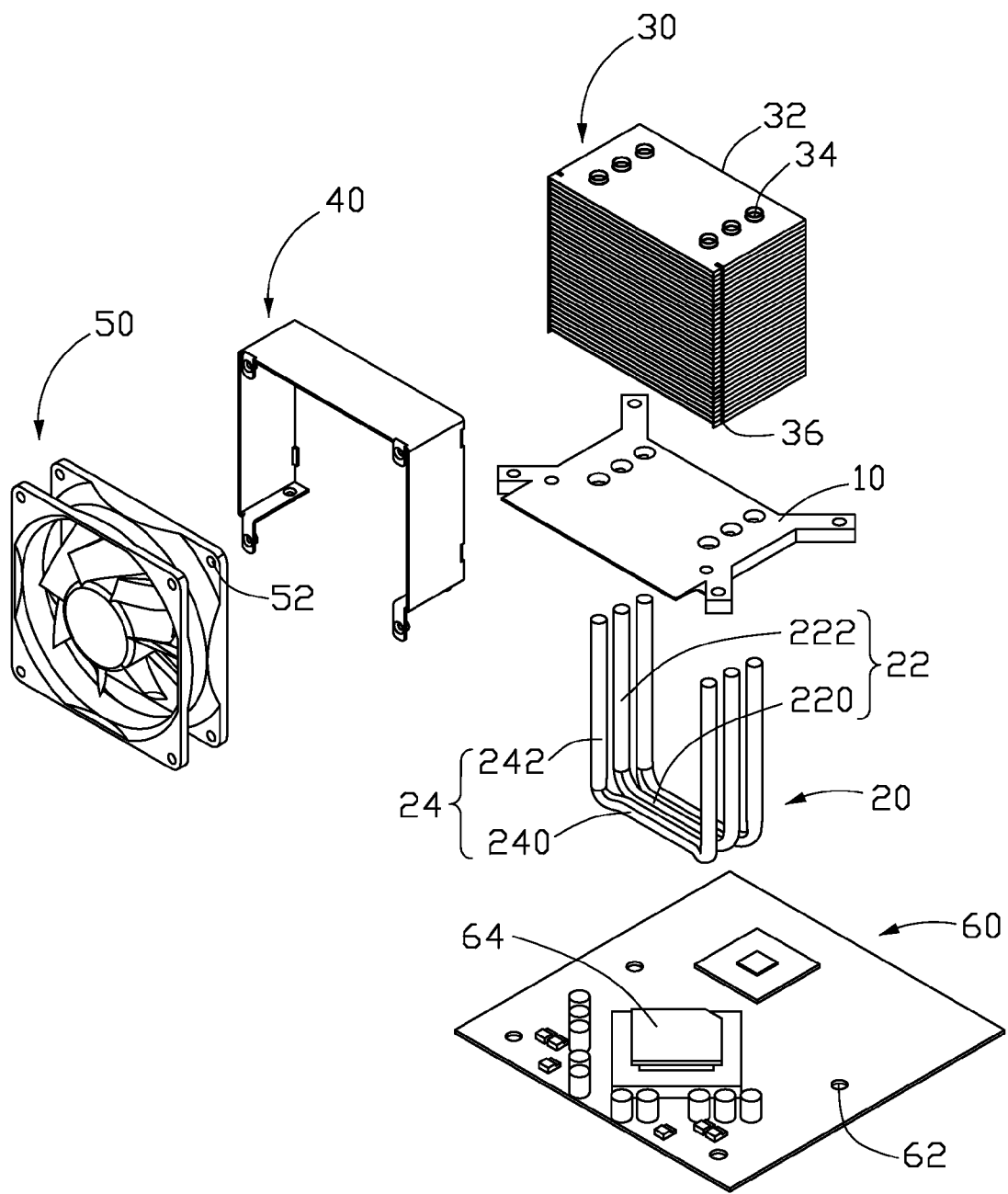
FIG. 2 is an exploded, isometric view of FIG. 1.
Figure 3:
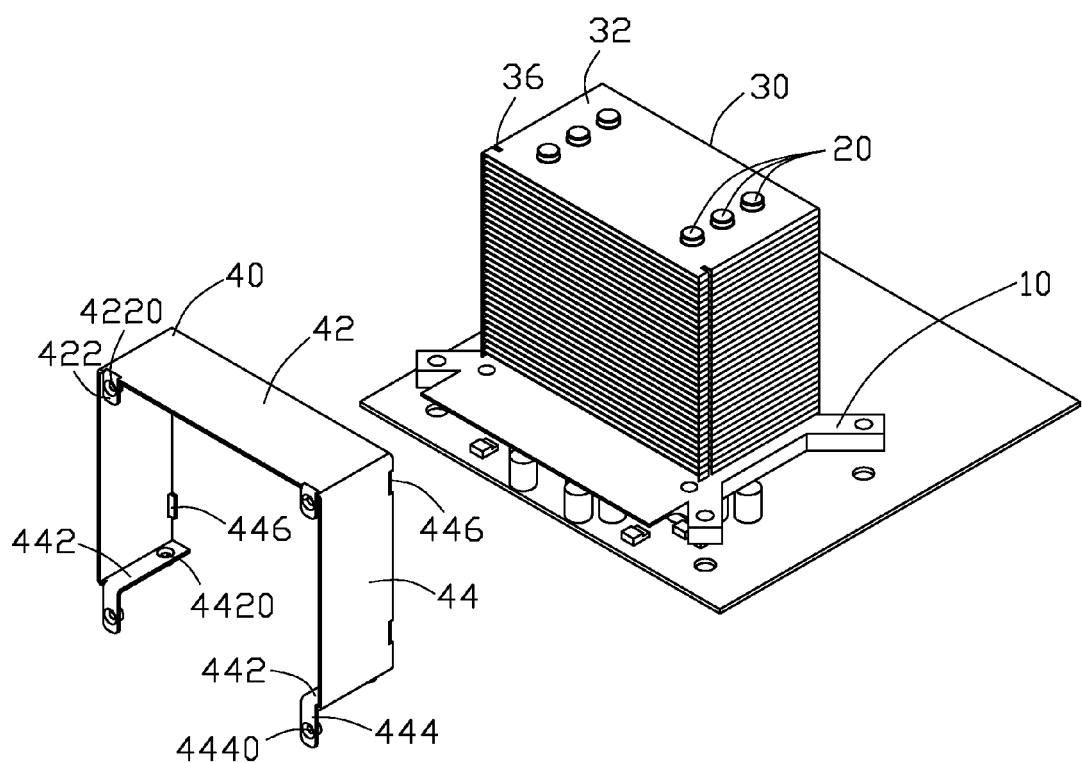
FIG. 3 is a partially assembled view of FIG. 2 without a fan of the heat dissipation device.

Referring to FIGS. 1-2, a heat dissipation device in accordance with a preferred embodiment of the present invention is shown. The heat dissipation device is used for being attached to a CPU 64 mounted on a printed circuit board 60, for removing heat from CPU 64. The heat dissipation device also simultaneously dissipates heat from a plurality of electronic components such as several discrete MOSFETS (not labeled) mounted on the printed circuit board 60 and around the CPU 64. The printed circuit board 60 defines four fixing holes 62 symmetrically around the CPU 64 for receiving fixtures (not shown) to secure the heat dissipation device thereon.

The heat dissipation device comprises a base 10, a fin set 30 mounted on the base 10, a heat pipe assembly 20 thermally connecting the base 10 with the fin set 30, a fan duct 40 fixed to a front side of the fin set 30 and a fan 50 mounted on the fan duct 40.

Figure 4:
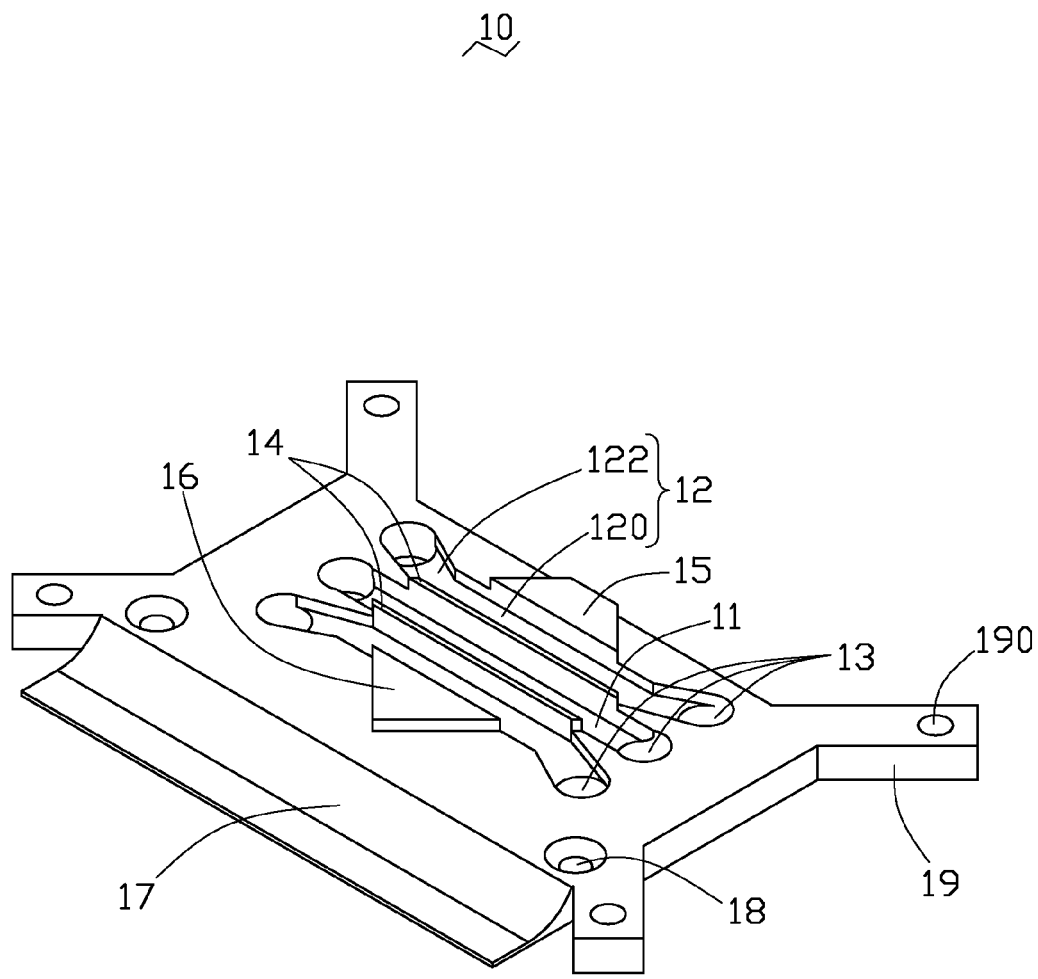
FIG. 4 is an inverted view of a base of the heat dissipation device of FIG. 2.

As shown in the FIG. 4, the base 10 is a rectangular metallic plate formed by die casting of a material having a high conductivity such as aluminum and copper. The base 10 defines a first groove 11 and two second grooves 12 in bottom surface thereof, for engaging with the heat pipe assembly 20. The first groove 11 is located in a middle portion of the base 10 and parallel to two opposite long sides of the base 10. The two second grooves 12 are respectively located at front and rear sides of the first groove 11 and symmetrical to each other relative to the first groove 11. The second groove 12 comprises an elongated portion 120 closely juxtaposed with the first groove 11 and two wing portions 122 extending obliquely from two opposite ends of the elongated portion 120 and away from the first groove 11. Each free end of the first and second grooves 11, 12 defines a through hole 13 therein for allowing the heat pipe assembly 20 to extend therethrough. Two elongated strips 14 protrude perpendicularly and downwardly from the bottom surface of the base 10 respectively between the first groove 11 and the second grooves 12. A trapeziform first protrusion 15 extends perpendicularly and downwardly from the bottom surface of the base 10. The first protrusion 15 is located between a middle portion of one of the second grooves 12 and a long side of the base 10 near the corresponding second groove 12. A triangular second protrusion 16 extends perpendicularly and downwardly from the bottom surface of the base 10. The second protrusion 16 is adjoining to a middle portion of another second groove 12. The strips 14, the first protrusion 15 and the second protrusion 16 are coplanar with each other at bottoms thereof. An airflow-guiding part 17 is provided at a front side of the base 10 near the second protrusion 16. The air-guiding part 17 can be various forms such as trapezium, triangle, arc etc., for guiding airflow generated by the fan 50 to the MOSFETS. In this embodiment, the airflow-guiding part 17 protrudes from the front side of the base 10 outwardly and has a flat top surface and a shaped bottom surface having a curve-shaped first section (not labeled) curved upwardly from the bottom surface of the base 10, and a flat second section (not labeled) extending outwardly from an outer edge of the first section. The flat top surface of the airflow-guiding part 17 is coplanar with a top surface of the base 10. The base 10 defines two engaging holes 18 respectively at two neighboring corners of the base 10 adjacent to the airflow-guiding part 17, for engaging with screws (not shown) to secure the fan duct 40 on the base 10. A fixing arm 19 extends outwardly and diagonally from each corner of the base 10, and defines a mounting hole 190 adjacent to a distal end thereof. The mounting holes 190 are in alignment with the fixing holes 62 of the printed circuit board 60 for receiving a fixture (not shown) to fix the heat dissipation device on the CPU 64 and the printed circuit board 60.

Particularly referring to FIG. 2, the heat pipes assembly 20 is composed of a first heat pipe 22 and two second heat pipes 24 respectively disposed at front and rear sides of the first heat pipe 22. Each of the first heat pipe 22 and the second heat pipes 24 has a U-shaped profile. The first heat pipe 22 comprises an elongated first evaporating section 220 and two parallel first condensing sections 222 perpendicularly and upwardly extending from two opposite ends of the first evaporating section 220. The second heat pipe 24 comprises a second evaporating section 240 and two parallel second condensing sections 242 perpendicularly and upwardly extending from two opposite ends of the second evaporating section 240. The second evaporating section 240 has a configuration fitting to the second groove 12 and comprises an elongated portion (not labeled) and two wing portions (not labeled) extending obliquely from two opposite ends of the elongated portion. The top and bottom surfaces of the first and second evaporating sections 240, 242 are flat so as to maximize a contacting area of the evaporating sections 240, 242 with the base 10 and the CPU 64.

The fin set 30 comprises a plurality of fins 32 spaced from each other and parallel to the base 10. Each of the fins 32 is horizontally oriented. The fin set 30 defines two rows of receiving holes 34 therein respectively adjacent to two lateral sides thereof. Each row includes three receiving holes 34 vertically extending through fins 32 of the fin set 30 for receiving the condensing sections 222, 242 of the heat pipes 22, 24 therein. Two engaging slots 36 perpendicular to two opposite lateral sides of the fin set 30 are respectively defined in the two opposite lateral sides of the fin set 30 and adjacent to the front side of the fin set 30, for engaging with the fan duct 40.

The fan duct 40 is integrally made of a piece of metal sheet and comprises a rectangular top panel 42 and two sidewalls 44 extending perpendicularly and downwardly from two opposite lateral edges of the top panel 42. The top panel 42 has two first fixing sheets 422 adjacent to the two opposite lateral edges thereof and extending downwardly from a front edge thereof. The two first fixing sheets 422 are perpendicular to the top panel 42 and each define a fixing orifice 4220 therein. A bottom end of each of the sidewalls 44 is bended inwardly and perpendicularly to form a mounting leg 442 located between the two sidewalls 44. The mounting leg 442 defines a through orifice 4420 adjacent to a rear end thereof, for allowing screws (not labeled) to extend therethrough and screw into the engaging hole 18 of the base 10, thereby fixing the fan duct 40 to the base 10. A second fixing sheet 444 bended downwardly and perpendicularly from a front end of each fixing leg 442, defines a fixing orifice 4440 therein. The second fixing sheets 444 are coplanar with and longer than the first sheets 422. The sidewalls 44 each have two spaced engaging tabs 446 extending inwardly from a rear edge thereof, for engaging into the engaging slot 36 of the fin set 30 when the fan duct 40 is secured to the base 10.

The fan 50 has a frame (not labeled) with a shape and size corresponding to that of the fan duct 40. The frame defines four fixing orifices 52 in four corners thereof, corresponding to the fixing orifices 4220, 4440 of the fixing sheets 422, 444. When screws (not shown) are used to extend through the orifices 52 to screw in the fixing orifices 4220, 4440, a lower part of the fan 50 faces the shaped bottom surface of the airflow-guiding part 17. Thus, a lower part of the airflow generated by the fan 50 can flow along the shaped bottom surface of the airflow-guiding part 17.

In assembly of the heat dissipation device, the fin set 30 is placed on the base 10 with its receiving holes 34 respectively communicating with the corresponding through holes 13 of the base 10. The first evaporating section 220 of the first heat pipe 22 and two second evaporating sections 240 of the second heat pipes 24 are respectively received in the first groove 11 and the second grooves 12 of the base 10. The bottom surfaces of the first evaporating section 220 of the first heat pipe 22 and two second evaporating sections 240 of the second heat pipes 24 level with the bottom surfaces of the strips 14, the first protrusion 15 and the second protrusion 16 so as to form a contacting face contacting with the CPU 64. The condensing sections 222, 242 of the first heat pipe 22 and two second evaporating sections 240 of the second heat pipes 24 extend through the corresponding through holes 13 of the base 10 to be received in the corresponding receiving holes 34 of the fin set 30. The engaging taps 446 of the fan duct 40 are engaged into the engaging slots 36 of the fin set 30. Two screws (not shown) extend through the corresponding through orifices 4420 of the fixing leg 442 of the fan duct 40 disposed on the base 10 to screw into the corresponding engaging holes 18 of the base 10. The fan 50 is connected to the fan duct 40 by the screws (not shown) extending through the fixing orifices 52 of the fan 50 to engage with the corresponding fixing orifices 4220, 4440 of the fan duct 40.

In use of the heat dissipation device, the heat dissipation device is mounted on the CPU 64 and located above the MOSFETS around the CPU 64 on the printed circuit board 60. Heat generated by the CPU 64 is absorbed by the evaporating sections 220, 240 of the heat pipes 22, 24, then transferred to the fin set 30 through the condensing sections 222, 242 of the heat pipes 22, 24 and finally brought into the ambient air by the fin set 30 exchanging heat with the airflow generated by the fan 50. Additionally, the fan 50 faces to the air-guiding part 17 of the base 10, whereby a small, lower portion of the airflow generated by the fan 50 reaches the air-guiding part 17 and is directed to the surrounding MOSFETS by the air-guiding part 17. The MOSFETS are thus cooled by the small, lower portion of the airflow guided by the air-guiding part 17. The heat of the fin set 30 absorbed from the CPU 64 via the heat pipe assembly 20 is forced to be dissipated to the surrounding environment by a large, upper portion of the airflow generated by the fan 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device adapted for dissipating heat from a CPU mounted on a printed circuit board, comprising:
    a base for being mounted on the CPU;
    a fin set disposed on the base; and
    a fan attached to the fin set by a duct;
        wherein the lateral side of the base is provide with an air-guiding part facing the fan, the air-guiding part guiding a lower, small portion of an airflow generated by the fan to pass through electronic components mounted on the printed circuit board and around the CPU, the electronic components being located below the air-guiding part, an upper, large portion of the airflow flowing through the fin set.

2. The heat dissipation device of claim 1, wherein the air-guiding part protrudes from the lateral side of the base outwardly and has a flat top surface and a shaped bottom surface.

3. The heat dissipation device of claim 2, wherein the shaped bottom surface of the air-guiding part comprises an arc-shaped inner section, curved upwardly from a bottom surface of the base.

4. The heat dissipation device of claim 3, wherein the shaped bottom surface of the air-guiding part comprises a flat, outer section extending outwardly from the arc-shaped inner section.

5. The heat dissipation device of claim 1 further comprising a heat pipe group extending through and thermally connecting the base and the fin set.

6. The heat dissipation device of claim 5, wherein the heat pipe group comprises three U-shaped heat pipes each having an evaporating section embedded in a bottom surface of the base and two condensing sections extending from two opposite ends of the evaporating section and vertically through the fin set.

7. The heat dissipation device of claim 6, wherein the bottom surface of the base has protrusion parts surrounding and level with bottom surfaces of the evaporating sections of the heat pipes so as to form a contacting face for contacting with the CPU.

8. The heat dissipation device of claim 1, wherein said a fan duct has a top panel and two sidewalls extending downwardly, the sidewalls each have at least an engaging tab protruding inwardly from an edge thereof and engaging into a lateral side of the fin set.

9. The heat dissipation device of claim 8, wherein the sidewalls of the fan duct each define a mounting leg extending inwardly from a bottom edge thereof, the top panel has two spaced fixing sheets extending downwardly from a lateral edge thereof, the mounting legs each have a fixing sheet extending downwardly from an end thereof, the four fixing sheets each define a fixing orifice therein for engaging with a screw to mount the fan on the fan duct.

10. A heat dissipation device adapted for dissipating heat from a CPU mounted on a printed circuit board, comprising:
    a base mounted on the CPU;
    a fin set comprising a plurality of spaced fins mounted on the base, each fin being horizontally oriented;
    a heat pipe group comprising at least a heat pipe having an evaporating section embedded in a bottom surface of the base and two condensing sections bent from two opposite ends of the evaporating section and extending vertically through the fins; and
    a fan attached to the fin set by a duct;
        wherein the lateral side of the base is provided with an air-guiding part facing the fan, the air-guiding part guiding a lower, small portion of an airflow generated by the fan to pass through a plurality of electronic components mounted on the printed circuit board and around the CPU, the electronic components being located below the air-guiding part, an upper, large portion of the airflow flowing through the fin set.

11. The heat dissipation device of claim 10, wherein the air-guiding part protrudes from the lateral side of the base outwardly and has a flat top surface and a shaped bottom surface.

12. The heat dissipation device of claim 11, wherein the shaped bottom surface of the air-guiding part comprises an arc-shaped inner section, curved upwardly from a bottom surface of the base.

13. The heat dissipation device of claim 10, wherein the at least one heat pipe comprises a first heat pipe and two second heat pipes at two lateral sides of the first heat pipe, and the evaporating section of each of the second heat pipes comprises an elongated portion juxtaposed with the evaporating section of the first heat pipe and two wing portions extending obliquely from two opposite ends of the elongated portions.

14. The heat dissipation device of claim 13, wherein a bottom surface of the base has protrusion parts surrounding and level with bottom surfaces of the elongated portions of the second heat pipes so as to form a contacting face contacting with the CPU.

* * * * *